US012764992B2

(12) United States Patent
Wu et al.

(10) Patent No.: US 12,764,992 B2
(45) Date of Patent: Oct. 13, 2026

(54) GATE-ALL-AROUND TRANSISTOR WITH HYBRID CONDUCTION MECHANISM AND MANUFACTURING METHOD THEREOF

(71) Applicants: FUDAN UNIVERSITY, Shanghai (CN); SHANGHAI INTEGRATED CIRCUIT MANUFACTURING INNOVATION CENTER CO., LTD., Shanghai (CN)

(72) Inventors: Chunlei Wu, Shanghai (CN); Yumin Xu, Shanghai (CN); Boqian Shen, Shanghai (CN); Fei Zhao, Shanghai (CN); Zichen Yang, Shanghai (CN); Wei Zhang, Shanghai (CN); Min Xu, Shanghai (CN)

(73) Assignees: FUDAN UNIVERSITY, Shanghai (CN); SHANGHAI INTEGRATED CIRCUIT MANUFACTURING INNOVATION CENTER CO., LTD., Shanghai (CN)

( * ) Notice: Subject to any disclaimer, the term of this patent is extended or adjusted under 35 U.S.C. 154(b) by 553 days.

(21) Appl. No.: 18/552,179

(22) PCT Filed: Dec. 30, 2022

(86) PCT No.: PCT/CN2022/144159

§ 371 (c)(1),
(2) Date: Sep. 24, 2023

(87) PCT Pub. No.: WO2024/138687

PCT Pub. Date: Jul. 4, 2024

(65) Prior Publication Data

US 2024/0429229 A1 Dec. 26, 2024

(51) Int. Cl.
*H10D 30/00* (2025.01)
*H10D 12/00* (2025.01)
(Continued)

(52) U.S. Cl.
CPC ......... *H10D 30/501* (2025.01); *H10D 12/021* (2025.01); *H10D 12/211* (2025.01);
(Continued)

(58) Field of Classification Search
CPC ........ H10D 30/501–509; H10D 30/019–0198; H10D 30/43–435; H10D 30/014;
(Continued)

(56) References Cited

U.S. PATENT DOCUMENTS

| | | | |
|---|---|---|---|
| 10,192,819 | B1 | 1/2019 | Chanemougame et al. |
| 2020/0098859 | A1 | 3/2020 | Reboh et al. |

(Continued)

FOREIGN PATENT DOCUMENTS

| | | | |
|---|---|---|---|
| CN | 104617138 | A | 5/2015 |
| CN | 114628500 | A | 6/2022 |
| CN | 114914159 | A | 8/2022 |

OTHER PUBLICATIONS

International Search Report, issued in PCT/CN2022/144159, dated Sep. 5, 2023.

(Continued)

*Primary Examiner* — Kevin Parendo
(74) *Attorney, Agent, or Firm* — Patentrant Consulting Group

(57) ABSTRACT

A gate-all-around transistor with hybrid conduction mechanism, including a GAA MOSFET, a second source region, and a second drain region. The GAA MOSFET includes a substrate, a first source region, and a first drain region. The first source region, the first drain region and the second drain region are doped with first ions, the second source region is doped with second ions. The second source region is formed between the substrate and the first source region, the second drain region is formed between the substrate and the first drain region. The height of the second source region and the
(Continued)

second drain region are not less than the height of the substrate between the first source region and the first drain region. It can realize the hybrid conduction of the gate channel diffusion drift current and the bottom channel band tunneling current to obtain better ultra-steep switching characteristics.

20 Claims, 5 Drawing Sheets

(51) Int. Cl.

| | |
|---|---|
| ***H10D 12/01*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 84/01*** | (2026.01) |
| ***H10D 84/03*** | (2025.01) |

(52) U.S. Cl.

CPC ....... *H10D 84/0109* (2025.01); *H10D 84/038* (2025.01); *H10D 30/014* (2025.01); *H10D 30/43* (2025.01); *H10D 30/6735* (2025.01); *H10D 30/6757* (2025.01); *H10D 62/121* (2025.01)

(58) Field of Classification Search

CPC .. H10D 62/121; H10D 62/112; H10D 62/114; H10D 30/0218; H10D 30/022

See application file for complete search history.

(56) References Cited

U.S. PATENT DOCUMENTS

| | | | |
|---|---|---|---|
| 2020/0105893 | A1 | 4/2020 | Xiao |
| 2020/0266060 | A1 | 8/2020 | Cheng et al. |

OTHER PUBLICATIONS

Written Opinion, issued in PCT/CN2022/144159, dated Sep. 5, 2023.

Examination Report, issued in CN202211730768.5 (priority application), by CNIPA, dated Nov. 24, 2025.

GATE-ALL-AROUND TRANSISTOR WITH HYBRID CONDUCTION MECHANISM AND MANUFACTURING METHOD THEREOF

TECHNICAL FIELD

The present invention relates to a semiconductor, in particular, to a gate-all-around (GAA) transistor with hybrid conduction mechanism and manufacturing method thereof.

BACKGROUND

Since the birth of integrated circuits, microelectronic integration technology has been continuously developing according to "Moore's Law". With the reduction of the size of Complementary Metal-Oxide-Semiconductor (CMOS) Field-Effect Transistors (FETs), the switching speed, density, function, and cost of microprocessors have significantly improved. However, device power consumption is still one of the major challenges in the process of device size reduction. The main technical approach to reduce device power consumption is to enhance the gate control capability of the device. After the Fin Field Effect Transistor (FinFET), the GAA nanowire/nanoplate field-effect transistor, due to its superior channel gate control capability, has become the next-generation mainstream logic device structure. Due to process fluctuations, the GAA nanowire device has a serious bottom parasitic channel leakage path. How to suppress the off-state leakage current has become one of the key challenges for the optimization of the GAA device.

Another effective method to reduce device power consumption is to reduce the power supply voltage VDD. The sub-threshold swing of traditional MOSFET device is limited by the kT/q thermodynamic distribution, and there is a theoretical limit of 60 mV/dec under room temperature conditions, which makes it impossible for ULSI chips based on traditional MOSFET devices to continue to reduce the power supply voltage. Tunneling Field-Effect Transistor (TFET) has become one of the most potential device in future ultra-low power integrated circuit applications due to its excellent sub-threshold characteristics, small off-state leakage current, low switching power consumption and other excellent electrical characteristics. The tunneling transistor can break the 60 mV/dec limit at room temperature because its conduction mechanism is quantum mechanical band-to-band tunneling, which is not limited by thermodynamic temperature. Therefore, the development of a transistor that can effectively suppress bottom leakage current and significantly improve the sub-threshold characteristics of the device has become a technical focus that needs to be solved by technical personnel in this field.

SUMMARY

The present invention provides a gate-all-around transistor with hybrid conduction mechanism and manufacturing method thereof to solve the problem of parasitic channel current leakage at the bottom of the GAA MOSFET device.

According to the first aspect of the present invention, a gate-all-around transistor with hybrid conduction mechanism is provided, including:

a GAA MOSFET device, including a substrate, a first source region and a first drain region; the first source region and the first drain region are arranged along a first direction; wherein, the first source region and the first drain region are doped with first ions; wherein, the first direction represents a direction parallel to the substrate;

a second source region and a second drain region, the second source region is formed between the substrate and the first source region, the second drain region is formed between the substrate and the first drain region, and the height of the second source region and the height of the second drain region are not lower than the height of the substrate between the first source region and the first drain region;

wherein, the second drain region is doped with the first ions, the second source region is doped with the second ions, and the type of the first ions is different from the type of the second ions.

Optionally, the thickness of the second source region and/or the second drain region is 5 nm-50 nm.

Optionally, the first ions are P-type ions or N-type ions.

Optionally, the second ions are P-type ions or N-type ions.

Optionally, the ion concentration doped in the second source region and/or the second drain region is 1 E16 $cm^{-3}$-1 E22 $cm^{-3}$.

Optionally, the material of the second source region and the material of the second drain region are binary or ternary compounds of group II-VI, group III-V, or group IV-IVs.

Optionally, the material of the second source region and the second drain region is Si, SiGe or Ge.

Optionally, the GAA MOSFET device also includes:

Channel layers, formed between the first source region and the first drain region, and all the channel layers are arranged at intervals along a second direction away from the substrate;

gate dielectric layers and a control gate, each gate dielectric layer wraps a portion of the surface of the corresponding channel layer; the control gate wraps the surface of all the gate dielectric layers;

inner walls, formed on the surface of the channel layers between the first source region and the each gate dielectric layer, and between the first drain region and the each gate dielectric layer;

a source metal layer, a gate metal layer, and a drain metal layer; the source metal layer and the drain metal layer are respectively formed on the surface of the first source region and the first drain region, and fully wrapped the first source region and the second source region and the first drain region and the second drain region, respectively; the gate metal layer is formed on the top of the control gate;

an interlayer dielectric layer, covering the surface of the source metal layer, the gate metal layer, the drain metal layer, and the inner walls;

a metal contact layer, penetrating the interlayer dielectric layer, and respectively connecting the source metal layer, the gate metal layer, and the drain metal layer.

According to the second aspect of the present invention, a method for manufacturing a gate-all-around transistor with hybrid conduction mechanism is provided, which is used to manufacture the gate-all-around transistor with hybrid conduction mechanism described in any one of the first aspect of the present invention, including:

forming the GAA MOSFET device and the second source region and the second drain region; wherein, the GAA MOSFET device includes the substrate, the first source region, and the first drain region; wherein, the first source region and the first drain region are doped with the first ion; the second source region and the second drain region are respectively formed between the substrate and the first source region, and between the substrate and the first drain region, and the height of the second source region and the height of the second drain region are not lower than the height of the substrate between the first source region and the first drain region;

wherein, the second drain region is doped with the first ions, the second source region is doped with the second ions.

Optionally, the forming of the GAA MOSFET device and the second source region and the second drain region; specifically includes:

providing the substrate;

forming sacrificial layers and channel layers; the sacrificial layers and the channel layers are alternately stacked on the substrate;

etching the sacrificial layers and the channel layers to form a fin structure, and over-etching the substrate on both sides of the fin structure along the first direction to form a first cavity and a second cavity; the first cavity and the second cavity are arranged along the first direction in sequence;

forming a dummy gate structure, and etching the two ends of the sacrificial layer along the first direction to form inner wall cavities;

forming inner walls; the inner walls are formed in the inner wall cavities;

forming the second source region and the second drain region; the second source region is formed in the first cavity, and the second drain region is formed in the second cavity;

forming the first source region and the first drain region; the first source region and the first drain region are respectively formed at the top of the second source region and the second drain region;

removing the dummy gate structure and releasing the channel layers;

forming gate dielectric layers, a control gate, a source metal layer, a gate metal layer, a drain metal layer, an interlayer dielectric layer;

Optionally, the forming of the second source region and the second drain region specifically includes:

forming a patterned first mask layer; the patterned first mask layer covers the surface of the second cavity, the dummy gate structure, and the inner walls;

filling a material of the second source region in the first cavity to form the second source region, and removing the patterned first mask layer;

forming a patterned second mask layer; the patterned second mask layer covers the surface of the second source region, the dummy gate structure, and the inner walls;

filling a material of the second drain region in the second cavity to form the second drain region, and removing the patterned second mask layer.

According to the third aspect of the present invention, an electronic device is provided, which includes the gate-all-around transistor with hybrid conduction mechanism described in any one of the first aspect of the present invention.

According to the fourth aspect of the present invention, a method for manufacturing an electronic device is provided, which includes the method for manufacturing a gate-all-around transistor with hybrid conduction mechanism described in any one of the second aspect of the present invention.

The gate-all-around transistor with hybrid conduction mechanism provided by the present invention, a second source region and a second drain region are respectively set between the first source region and the substrate, and between the first drain region and the substrate; the second drain region is doped with first ions, and the second source regions doped with the second ions; the type of the first ions is different from the type of the second ions; so as to form a reverse-biased P-I-N channel at the bottom, which can significantly suppress the leakage current of the bottom parasitic channel of the traditional GAA MOSFET device, thereby enhancing the current switch ratio of the device.

Further, due to the addition of the second source region and the second drain region, which is equivalent to that the bottom of the traditional GAA MOSFET device being connected in parallel with a tunneling field-effect transistor (TFET) device structure. Therefore, the gate-all-around transistor with hybrid conduction mechanism provided by the present invention can realize the hybrid conduction of the gate channel diffusion drift current and the bottom channel quantum mechanics band-to-band tunneling current, thus can obtain ultra-steep switching characteristics below 60 mV/dec. At the same time, the conduction of the GAA MOSFET device in parallel above can provide a large current for the device.

BRIEF DESCRIPTION OF DRAWINGS

In order to illustrate the technical solutions in the embodiments according to the present disclosure or in the prior art more clearly, a brief introduction may be given hereinafter to the accompany drawings required to be used in the description of the embodiments or the prior art. Apparently, the accompany drawings in the description below are merely some embodiments of the present disclosure, and other accompany drawings may be obtained by those of ordinary skilled in the art according to these accompany drawings without paying any creative labor.

DESCRIPTION OF REFERENCE SIGNS

Figure 1:
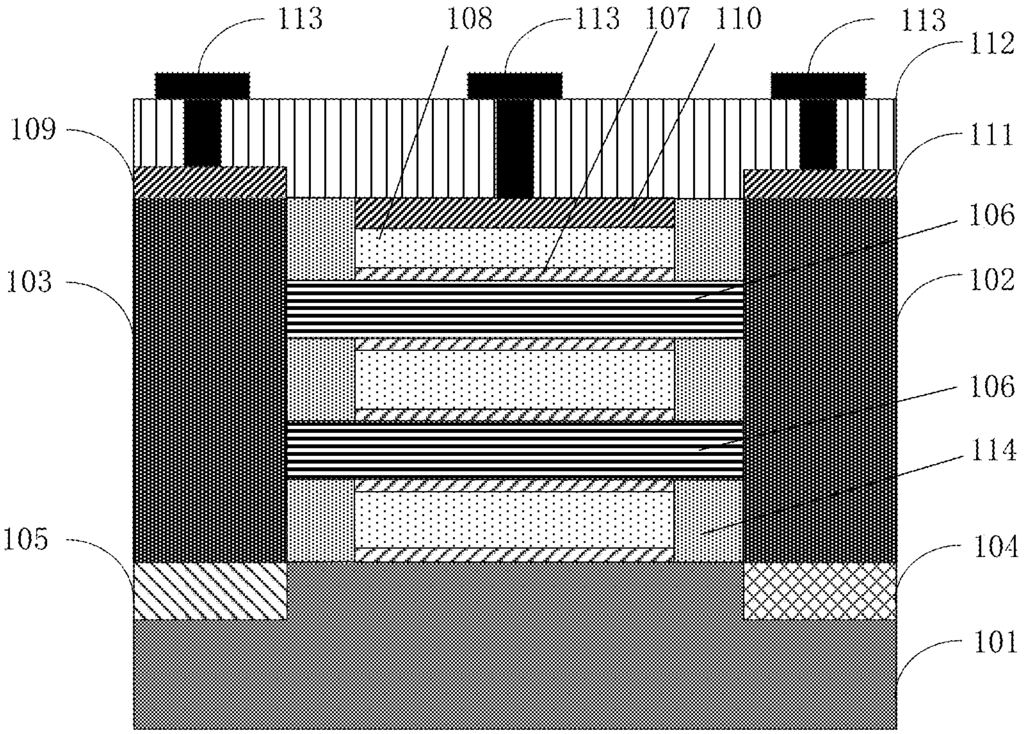
FIG. 1 is a schematic diagram of the structure of a gate-all-around transistor with hybrid conduction mechanism in an embodiment of the present disclosure.

101—Substrate;
102—First source region;
103—First drain region;
104—Second source region;
105—Second drain region;
106—Channel layer;
107—Gate dielectric layer;
108—Control gate;
109—Drain metal layer;
110—Gate metal layer;
111—Source metal layer;
112—Interlayer dielectric layer;
113—Metal interconnect layer;
114—Inner wall;
115—Dummy gate structure;

116—Photoresist.

DESCRIPTION OF EMBODIMENTS

The following clearly and completely describes the technical solutions in the embodiments of the present invention with reference to the accompanying drawings in the embodiments of the present invention. Obviously, the described embodiments are merely some but not all of embodiments of the present invention. Based on the embodiments of the present invention, all other embodiments obtained by those of ordinary skill in the art without creative efforts should fall within the protection scope of the present invention.

In the specification, claims and accompanying drawings of the present invention, the terms "first", "second", "third", "fourth" and so on (if any) are intended to distinguish between similar objects but do not necessarily indicate a specific order or sequence. It should be understood that the terms so used may be interchanged where appropriate, so that the embodiments described herein can be implemented in a sequence other than what is illustrated or described herein. Furthermore, the terms "comprise" and "include" and any variations thereof are intended to cover a non-exclusive inclusion, such that a process, method, system, product or apparatus that includes a list of steps or units does not include only those steps or units, but may include other steps or units not explicitly listed or inherent to such process, method, product or apparatus.

Since the birth of integrated circuits, microelectronics integration technology has been continuously developing according to "Moore's Law". With the reduction of the size of complementary metal oxide semiconductor (CMOS) field effect transistors (FETs), the switching speed, density, function, and cost of microprocessors have significantly improved. However, device power consumption is still one of the major challenges in the process of device size reduction. The main technical approach to reduce device power consumption is to enhance the gate control ability of the device. After the fin-type transistor, the surround GAA nanowire/nanoplate field effect transistor has become the mainstream logic device structure for the next generation due to its superior channel gate control ability. Due to process fluctuations, surround GAA nanowire devices have serious bottom parasitic channel leakage path. How to suppress the off-state leakage current has become one of the key challenges for GAA device optimization.

Another effective method to reduce device power consumption is to reduce the power supply voltage VDD. The sub-threshold swing of traditional MOSFET devices is limited by the kT/q thermodynamic distribution at room temperature and has a theoretical limit of 60 mV/dec. This makes it impossible for ULSI chips based on traditional MOSFET devices to continuously reduce the power supply voltage. Tunneling field-effect transistors (TFETs) have become one of the most promising devices for future ultra-low power integrated circuit applications due to their excellent sub-threshold characteristics, smaller off-state leakage current, and low switching power consumption. The conduction mechanism of the tunneling transistor is quantum mechanical band-to-band tunneling, which is not limited by thermodynamic temperature. Its sub-threshold swing at room temperature can break the limit of 60 mV/dec.

In view of this, the inventors of this application, by adding a source region and a drain region at the bottom parasitic channel, forms a structure similar to a tunneling transistor at the bottom of the surround GAA nanowire/nanoplate field effect transistor; the new structure of the tunneling transistor combined with the surround GAA nanowire/nanoplate field effect transistor can effectively suppress the bottom leakage current and significantly improve the sub-threshold characteristics of the device.

The technical solutions of the present invention are described in detail below with specific embodiments. The following specific embodiments may be combined with each other, and the same or similar concepts or processes may not be repeated in some embodiments.

Referring to FIG. 1 to FIG. 6, according to an embodiment of the present invention, a GAA transistor with hybrid conduction mechanism is provided, which includes: a GAA MOSFET device, a second source region 104 and a second drain region 105.

As shown in FIG. 1, the GAA MOSFET device includes a substrate 101, a first source region 102, and a first drain region 103; the first source region 102 and the first drain region 103 are arranged along a first direction; wherein, the first source region 102 and the first drain region 103 are doped with first ions; wherein, the first direction represents the direction parallel to the substrate 101;

- the second source region 104 is formed between the substrate 101 and the first source region 102, the second drain region 105 is formed between the substrate 101 and the first drain region 103, and the height of the second source region 104 and the second drain region 105 is not lower than the height of the substrate 101 between the first source region 102 and the first drain region 103;
- wherein, the second drain region 105 is doped with first ions, the second source region 104 is doped with second ions, and the type of the first ions is different from the type of the second ions.

Wherein, the second source region and the second drain region can be a single structure layer or can be set as a multi-layer structure layer, and the present invention is not limited thereto.

Compared with the existing GAA MOSFET device, the GAA transistor with hybrid conduction mechanism provided by the present invention, sets a second source region and a second drain region between the first source region and the substrate, and between the first drain region and the substrate, respectively. The second drain region is doped with first ions, the second source region is doped with second ions, and the type of the first ions is different from the type of the second ions. In the off state, a reverse-biased P-I-N channel is formed at the bottom, which can significantly suppress the leakage current of the bottom parasitic channel of the traditional GAA MOSFET device, thereby enhancing the current switch ratio of the device.

Further, due to the addition of the second source region and the second drain region, which is equivalent to that the bottom of the traditional GAA MOSFET device being connected in parallel with a tunneling field-effect transistor (TFET) device structure, so in the on state of the device, the GAA transistor with hybrid conduction mechanism provided by the present invention can realize the hybrid conduction of gate channel diffusion drift current and bottom channel quantum mechanical band-to-band tunneling current, so that the entire device can obtain a sub-threshold swing characteristic of below 60 mV/dec. At the same time, in the on state, the upper parallel GAA MOSFET device is turned on, which can provide a large current for the device.

In one embodiment, the first ions are P-type ions or N-type ions.

In one embodiment, the second ions are P-type ions or N-type ions.

Specifically, the P-type ions are: boron hydrides, fluorides or chlorides, specifically one or a combination of the following materials: $B_2H_6$, $B_4H_{10}$, $B_6H_{10}$, $B_{10}H_{14}$, $B_{18}H_{22}$, $BF_3$ or $BCl_3$; the N-type ions are: phosphorus and arsenic hydrides, fluorides, specifically one or a combination of the following materials: phosphine, arsine, phosphorus pentafluoride, phosphorus trifluoride, arsenic pentafluoride or arsenic trifluoride.

The channel region and the bottom Fin region (i.e., the substrate 101 between the second source region 104 and the second drain region 105) are undoped or lightly doped i-regions.

For N-type devices, the first source region 102 is N-type doped region, with a doping concentration of about 1 E18 $cm^{-3}$-1 E22 $cm^{-3}$, the first drain region 103 is N-type doped region, with a doping concentration of about 1 E18 $cm^{-3}$-1 E22 $cm^{-3}$, the second source region 104 is P-type doped region, with a doping concentration of about 1 E18 $cm^{3}$-1 E22 $cm^{-3}$, the second drain region 105 is N-type doped region, with a doping concentration of about 1 E16 $cm^{-3}$-1 E21 $cm^{-3}$.

For P-type devices, the first source region 102 is P-type doped region, with a doping concentration of about 1 E18 $cm^{-3}$-1 E22 $cm^{-3}$, the first drain region 103 is P-type doped region, with a doping concentration of about 1 E18 $cm^{-3}$-1 E20 $cm^{-3}$, the second source region 104 is N-type doped region, with a doping concentration of about 1 E18 $cm^{-3}$-1 E22 $cm^{-3}$, the second drain region 105 is P-type doped region, with a doping concentration of about 1 E16 $cm^{-3}$-1 E21 $cm^{-3}$.

In the GAA transistor with hybrid conduction mechanism, the thickness and doping concentration of the second source region and the second drain region are important parameters of device design. If the thickness of the second source region or the second drain region is too thin, the influence of the bottom tunnel field effect transistor on the total current is small, and the improvement of the sub-threshold swing characteristic of the device is limited; if the thickness of the second source region or the second drain region is too thick, it will increase the difficulty of the process, leading to a decrease in the consistency and reliability of the device. The doping concentration of the second source region cannot be too low. If the doping concentration is too low, it will lead to an increase in the resistance of the second source region, and the lower doping will reduce the tunneling probability of the bottom tunnel transistor, making band-to-band tunneling more difficult to occur, and the current will decrease. The doping concentration of the second drain region also needs to be controlled within a certain range. If the doping concentration is too low, it will lead to an increase in the resistance of the bottom drain region and a decrease in current; if the doping concentration is too high, it will lead to a more significant bipolar effect in the TFET device channel. Therefore in a preferred embodiment, the thickness of the second source region 104 and/or the second drain region 105 is 5 nm-50 nm. In a preferred embodiment, the ion doping concentration in the second source region 104 and/or the second drain region 105 is 1 E16 $cm^{-3}$-1 E22 $cm^{-3}$.

In one embodiment, the material of the second source region 104 and the material of the second drain region 105 are binary or ternary compounds of group II-VI, group III-V, or group IV-IV.

In one embodiment, the material of the second source region 104 and the second drain region 105 is Si, SiGe or Ge.

In one embodiment, the GAA MOSFET device also includes:

channel layers 106, formed between the first source region 102 and the first drain region 103, and all the channel layers 106 are arranged at intervals in the second direction away from the substrate 101;

gate dielectric layers 107 and a control gate 108, wherein each gate dielectric layer 107 wraps a portion of the surface of the corresponding channel layer 106; the control gate 108 wraps the surface of all the gate dielectric layers 107;

inner walls 114, formed on the surface of the channel layers 106 between the first source region 102 and the gate dielectric layer 107, and between the first drain region 103 and the gate dielectric layer 107;

a source metal layer 111, a gate metal layer 110, and a drain metal layer 109; in one implementation, the source metal layer 111 and the drain metal layer 109 are respectively formed on the surfaces of the first source region 102 and the first drain region 103, and respectively fully wrapped the first source region 102 and the first drain region 103; the gate metal layer 110 is formed at the top of the control gate 108; because the second source region and the second drain region will have additional parasitic resistance that is not conducive to the steep sub-threshold swing characteristics of the device, therefore, in a preferred implementation, the source metal layer 111 and the drain metal layer 109 are respectively formed on the surfaces of the first source region 102 and the first drain region 103; and respectively fully wrapped the first source region 102 and the second source region 104, and the first drain region 103 and the second drain region 105; the gate metal layer 110 is formed at the top of the control gate 108;

an interlayer dielectric layer 112, covering the surfaces of the source metal layer 111, the gate metal layer 110, the drain metal layer 109, and the inner walls 114;

a metal contact layer 113, penetrating the interlayer dielectric layer 112, and respectively connecting the source metal layer 111, the gate metal layer 110, and the drain metal layer 109.

According to other embodiments of the present invention, a method for manufacturing a GAA transistor with hybrid conduction mechanism is also provided, for manufacturing the GAA transistor with hybrid conduction mechanism described in any one of the preceding embodiments of the present invention, including:

form the GAA MOSFET device and the second source region 104 and the second drain region 105; wherein the GAA MOSFET device includes the substrate 101, the first source region 102, and the first drain region 103; wherein the first source region 102 and the first drain region 103 are doped with the first ions; the second source region 104 and the second drain region 105 are respectively formed between the substrate 101 and the first source region 102, and between the substrate 101 and the first drain region 103; and the height of the second source region 104 and the second drain region 105 is not lower than the height of the substrate 101 between the first source region 102 and the first drain region 103. Wherein, the second drain region 105 is doped with the first ions, and the second source region 104 is doped with the second ions.

Figure 2:
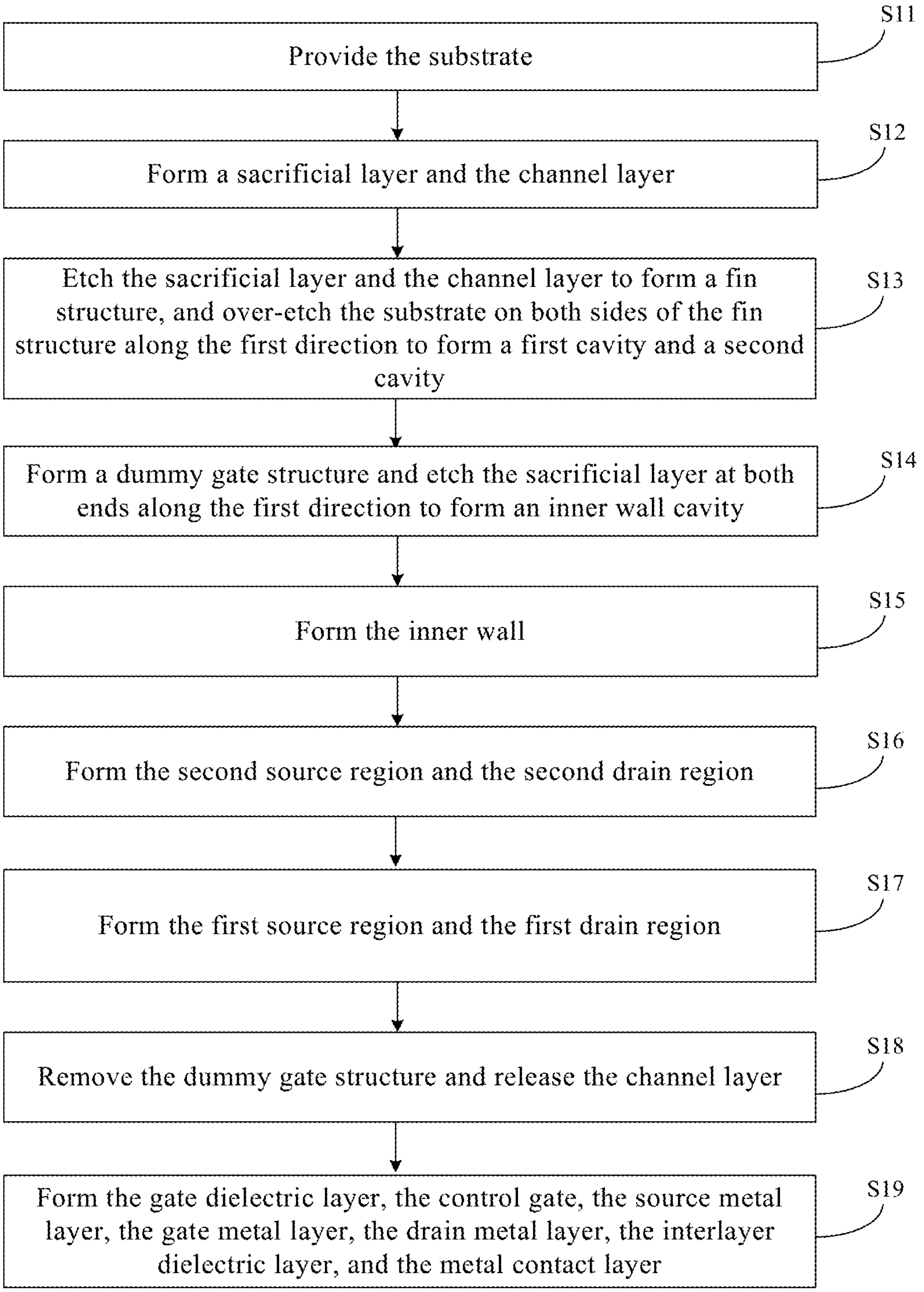
FIG. 2 is a flowchart of a method for manufacturing a gate-all-around transistor with hybrid conduction mechanism in an embodiment of the present disclosure.

In one embodiment, as shown in FIG. 2, the formation of the GAA MOSFET device, the second source region 104 and the second drain region 105, specifically includes:

S11: Provide the substrate 101;

S12: Form sacrificial layers and channel layers 106; the sacrificial layers and the channel layers 106 are alternately stacked on the substrate 101; specifically, the material of the sacrificial layer is SiGe, and the material of the channel layers 106 is Si; in a specific embodiment, the sacrificial layers and the channel layers 106 are: Si/SiGe stack with a crystal orientation of <100>, each layer is about 10-20 nm thick;

In one implementation, light doping is performed in the sacrificial layers and the channel layers 106; specifically, the range of light doping in the Si/SiGe stack is: 1 E13 $cm^{-3}$-1 E15 $cm^{-3}$.

Figure 3:
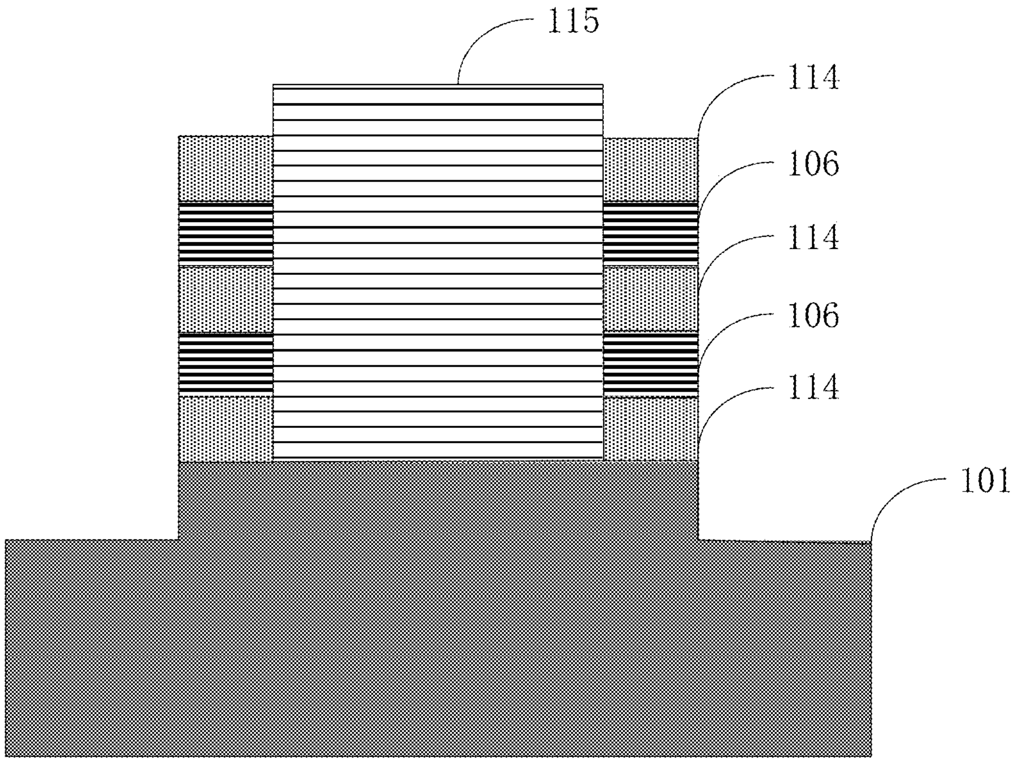
FIG. 3-FIG. 6 are schematic diagrams of device structures at different process stages manufactured according to a method for manufacturing a gate-all-around transistor with hybrid conduction mechanism in an embodiment of the present disclosure.
Figure 4:
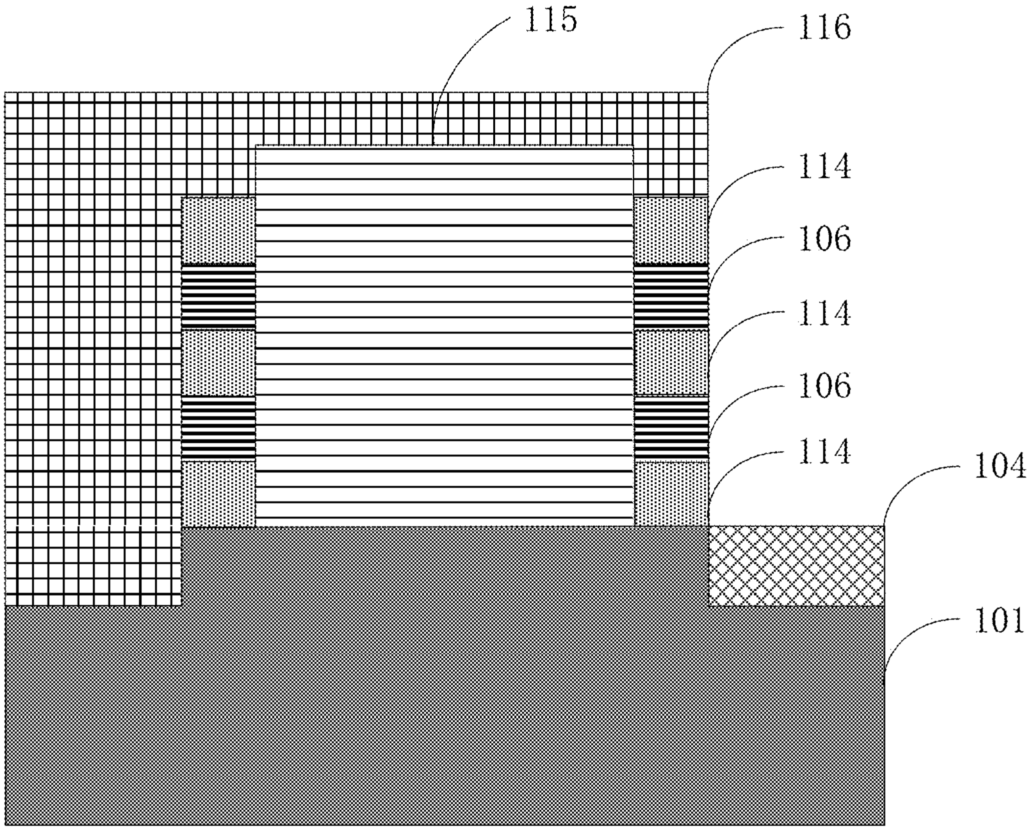
Figure 5:
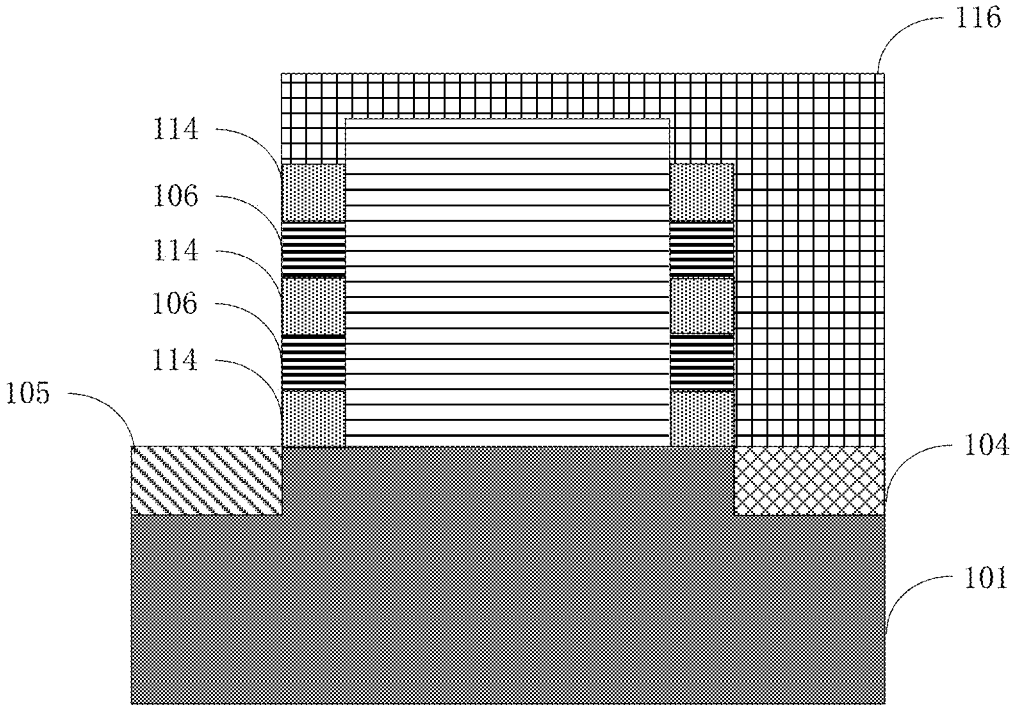

In other implementations, no ions are doped in the sacrificial layers and the channel layers 106;

S13: Etch the sacrificial layers and the channel layers 106 to form a fin structure, control the length of the device channel to be about 50 nm-100 nm, and over-etch the substrate 101 on both sides of the fin structure along the first direction to form a first cavity and a second cavity; wherein the first cavity and the second cavity are arranged in sequence along the first direction;

After forming the fin structure in step S13, it also includes: forming an STI structure by using photolithography for STI isolation patterning; wherein the depth of the photolithography is about 5 nm-50 nm, and the material of the STI structure is SiO2;

S14: Form a dummy gate structure 115, and etch the sacrificial layer at both ends along the first direction to form inner wall cavities; specifically, the material of the dummy gate structure 115 is polysilicon; the method used to form the dummy gate structure 115 is: atomic layer deposition, chemical vapor deposition or physical vapor deposition; the thickness of the dummy gate structure 115 is 50 nm;

S15: Form the inner walls 114, as shown in FIG. 3; the inner walls 114 are formed in the inner wall cavities; specifically, the material of the inner walls 114 is selected from $SiO_2$, $Si_3N_4$ or other low K dielectric materials; the method of forming the inner walls 114 is similar to the method of forming the dummy gate structure 115, and will not be repeated here;

S16: Form the second source region 104 and the second drain region 105; the second source region 104 is formed in the first cavity, and the second drain region 105 is formed in the second cavity;

In one embodiment, the step S16 for forming the second source region 104 and the second drain region 105, specifically includes:

S161: Form a patterned first mask layer; the patterned first mask layer covers the surface of the second cavity, the dummy gate structure 115, and the inner walls 114;

S162: Fill the material of the second source region 104 in the first cavity to form the second source region 104, remove the patterned first mask layer, as shown in FIG. 4;

In one implementation, B ions are doped in the second source region 104, with a concentration of about 1 E21 $cm^{-3}$;

S163: Form a patterned second mask layer; the patterned second mask layer covers the surface of the second source region 104, the dummy gate structure 115, and the inner walls 114; the second patterned mask layer and the first patterned mask layer are photoresist 116;

S164: Fill the material of the second drain region 105 in the second cavity to form the second drain region 105, remove the patterned second mask layer, as shown in FIG. 5;

In one implementation, the materials of the second source region 104 and the second drain region 105 is: SiGe or Si:C;

Wherein, because the second source region 104 and the second drain region 105 of the device use SiGe/Si:C epitaxy, it is beneficial to increase the band-to-band tunneling probability of the channel material.

In one implementation, the second drain region 105 is doped with As ions, with a concentration of approximately 1 E18 $cm^{-3}$.

In one implementation, the method used to form the second source region 104 or the second drain region 105 is in-situ epitaxy, atomic layer deposition, or chemical vapor deposition.

In one implementation, one of the following methods is used for high doping of the first source region 102 or the second source region 104: in-situ doping, ion implantation, or solid-source doping.

S17: Form the first source region 102 and the first drain region 103; the first source region 102 and the first drain region 103 are formed at the top of the second source region 104 and the second drain region 105, respectively;

In one implementation, the material of the first source region 102 and the first drain region 103 is SiGe or Si:C.

Since the first source region 102 and the first drain region 103 of the device adopt SiGe/Si:C epitaxy, further stress will be applied to the GAA nanowires/nanosheets, which is beneficial for increasing the carrier mobility of the channel material. In one specific implementation, the first source region 102 and the first drain region 103 are in-situ doped with As ions, with a concentration of approximately 1 E21 cm-3; after ion doping, a rapid high-temperature annealing is performed to activate the implanted impurities (1050° C., 10 s).

Figure 6:
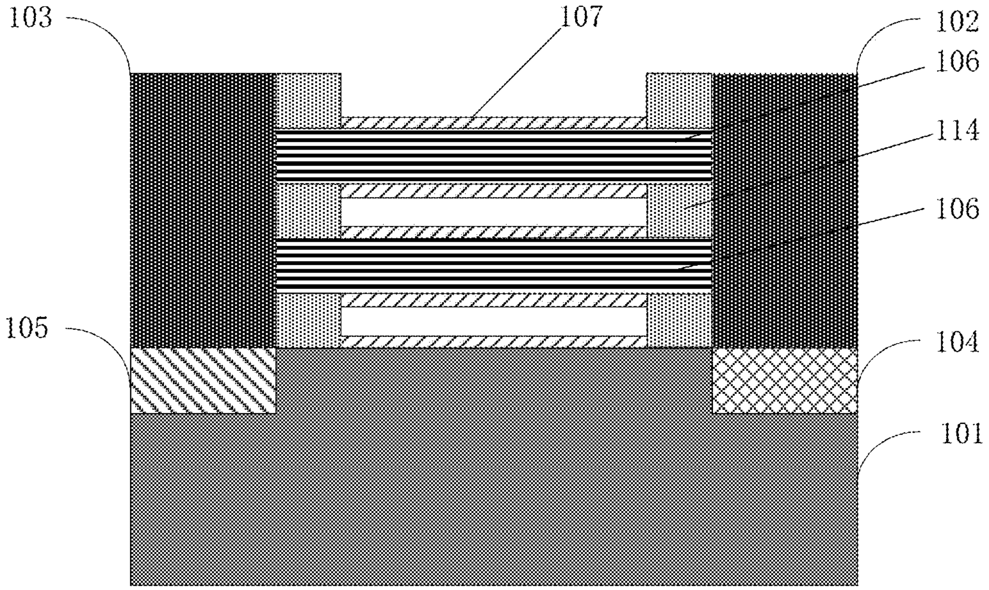

S18: Remove the dummy gate structure 115 and release the channel layers 106, as shown in FIG. 6;

S19: Form the gate dielectric layer 107, the control gate 108, the source metal layer 111, the gate metal layer 110, the drain metal layer 109, the interlayer dielectric layer 112, and the metal contact layer 113. Specifically, the material of the gate dielectric layer 107 is SiO2, Si3N4, or high-k dielectric material; the material of the control gate 108 is selected from doped polysilicon, metal cobalt, nickel, and other metals or metal silicides.

The growth methods of the gate dielectric layer 107 include conventional thermal oxidation, nitrogen-doped thermal oxidation, atomic layer deposition, or chemical vapor deposition.

In one specific implementation, the material of the gate dielectric layer 107 is HfO2, with a thickness of 1~5 nm; the gate material is a TiN layer, with a thickness of 50~200 nm;

Furthermore, according to one implementation of the present invention, an electronic device is provided, comprising any one of the aforementioned embodiments of the GAA transistor with hybrid conduction mechanism of the present invention.

Additionally, according to one implementation of the present invention, a method of manufacturing an electronic device is provided, comprising any one of the aforementioned embodiments of the manufacturing method of the GAA transistor with hybrid conduction mechanism of the present invention.

Finally, it should be noted that the above embodiments are only used to illustrate the technical solutions of the present invention, and should not be construed as limiting the scope of the present invention. Although detailed descriptions have been provided for the above embodiments, those skilled in the art should understand that modifications can be made to the technical solutions described in the above embodiments, or equivalent substitutions can be made for some or all of the technical features. Such modifications or substitutions do not depart from the essence of the technical solutions of the embodiments of the present invention.

The invention claimed is:

1. A gate-all-around transistor with hybrid conduction mechanism, including:

a GAA MOSFET device, which includes a substrate, a first source region, and a first drain region; the first source region and the first drain region are arranged along a first direction; wherein, the first source region and the first drain region are doped with first ions; wherein, the first direction represents a direction parallel to the substrate;

a second source region and a second drain region, the second source region is formed between the substrate and the first source region, and the second drain region is formed between the substrate and the first drain region, and a location of a top surface of the second source region in a direction perpendicular to the substrate and a location of a top surface of the second drain region in the direction perpendicular to the substrate are not lower than a location of a top surface of the substrate in the direction perpendicular to the substrate between the first source region and the first drain region;

wherein, the second drain region is doped with the first ions, and the second source region is doped with second ions, and the type of the first ions is different from the type of the second ions.

2. The gate-all-around transistor with hybrid conduction mechanism according to claim 1, wherein a thickness of the second source region and/or the second drain region is 5 nm-50 nm.

3. The gate-all-around transistor with hybrid conduction mechanism according to claim 1, wherein the first ions are P-type ions or N-type ions.

4. The gate-all-around transistor with hybrid conduction mechanism according to claim 1, wherein the second ions are P-type ions or N-type ions.

5. The gate-all-around transistor with hybrid conduction mechanism according to claim 1, wherein an ion concentration doped in the second source region and/or the second drain region is $1E16cm^{-3}$-$1E22cm^{-3}$.

6. The gate-all-around transistor with hybrid conduction mechanism according to claim 1, wherein a material of the second source region and a material of the second drain region are binary or ternary compounds of group II-VI, group III-V, or group IV-IV.

7. The gate-all-around transistor with hybrid conduction mechanism according to claim 1, wherein the material of the second source region and the second drain region is Si, SiGe or Ge.

8. The gate-all-around transistor with hybrid conduction mechanism according to claim 1, wherein the GAA MOSFET device also includes:

channel layers, formed between the first source region and the first drain region, and all the channel layers are arranged at intervals along a second direction away from the substrate;

gate dielectric layers and a control gate, each gate dielectric layer wraps a portion of the surface of a corresponding channel layer; the control gate wraps the surface of all the gate dielectric layers;

inner walls, formed on the surface of the channel layers between the first source region and the each gate dielectric layer, and between the first drain region and the each gate dielectric layer;

a source metal layer, a gate metal layer, and a drain metal layer; the source metal layer and the drain metal layer are respectively formed on the surface of the first source region and the first drain region, and fully wrapped the first source region and the second source region, and the first drain region and the second drain region, respectively; the gate metal layer is formed on the top of the control gate;

an interlayer dielectric layer, covering the surface of the source metal layer, the gate metal layer, the drain metal layer, and the inner walls;

a metal contact layer, penetrating the interlayer dielectric layer, and respectively connecting the source metal layer, the gate metal layer, and the drain metal layer.

9. A method for manufacturing a gate-all-around transistor with hybrid conduction mechanism, used to manufacture the gate-all-around transistor with hybrid conduction mechanism according to claim 1, wherein the method includes:

forming the GAA MOSFET device, the second source region and the second drain region;

the GAA MOSFET device includes the substrate, the first source region, and the first drain region;

the first source region and the first drain region are doped with the first ions;

the second source region and the second drain region are respectively formed between the substrate and the first source region, and between the substrate and the first drain region, and a location of a top surface of the second source region in a direction perpendicular to the substrate and a location of a top surface of the second drain region in the direction perpendicular to the substrate are not lower than a location of a top surface of the substrate in the direction perpendicular to the substrate between the first source region and the first drain region;

wherein, the second drain region is doped with the first ions, and the second source region is doped with the second ions.

10. The method for manufacturing a gate-all-around transistor with hybrid conduction mechanism according to claim 9, wherein the forming of the GAA MOSFET device, the second source region and the second drain region, includes:

providing the substrate;

forming sacrificial layers and channel layers; the sacrificial layers and the channel layers are alternately stacked on the substrate;

etching the sacrificial layers and the channel layers to form a fin structure, and over-etching the substrate on both sides of the fin structure along the first direction to form a first cavity and a second cavity; the first cavity and the second cavity are arranged along the first direction in sequence;

forming a dummy gate structure, and etching the two ends of the sacrificial layers along the first direction to form inner wall cavities;

forming inner walls; the inner walls are formed in the inner wall cavities;

forming the second source region and the second drain region; the second source region is formed in the first cavity, and the second drain region is formed in the second cavity;

forming the first source region and the first drain region; the first source region and the first drain region are respectively formed at the top of the second source region and the second drain region;

removing the dummy gate structure and releasing the channel layers;

forming gate dielectric layers, a control gate, a source metal layer, a gate metal layer, a drain metal layer, an interlayer dielectric layer.

11. The method for manufacturing a gate-all-around transistor with hybrid conduction mechanism according to claim 10, the method for manufacturing a gate-all-around transistor with hybrid conduction mechanism, wherein the forming of the second source region and the second drain region, includes:

forming a patterned first mask layer; the patterned first mask layer covers the surface of the second cavity, the dummy gate structure, and the inner walls;

filling a material of the second source region in the first cavity to form the second source region, and removing the patterned first mask layer;

forming a patterned second mask layer; the patterned second mask layer covers the surface of the second source region, the dummy gate structure, and the inner walls;

filling a material of the second drain region in the second cavity to form the second drain region, and removing the patterned second mask layer.

12. An electronic device, including the gate-all-around transistor with hybrid conduction mechanism according to claim 1.

13. The method for manufacturing a gate-all-around transistor with hybrid conduction mechanism according to claim 9, wherein a thickness of the second source region and/or the second drain region is 5 nm-50 nm.

14. The method for manufacturing a gate-all-around transistor with hybrid conduction mechanism according to claim 9, wherein the first ions are P-type ions or N-type ions.

15. The method for manufacturing a gate-all-around transistor with hybrid conduction mechanism according to claim 9, wherein the second ions are P-type ions or N-type ions.

16. The method for manufacturing a gate-all-around transistor with hybrid conduction mechanism according to claim 9, wherein an ion concentration doped in the second source region and/or the second drain region is $1E16cm^{-3}$-$1E22cm^{-3}$.

17. The method for manufacturing a gate-all-around transistor with hybrid conduction mechanism according to claim 9, wherein a material of the second source region and a material of the second drain region are binary or ternary compounds of group II-VI, group III-V, or group IV-IV.

18. The method for manufacturing a gate-all-around transistor with hybrid conduction mechanism according to claim 9, wherein a material of the second source region and the second drain region is Si, SiGe or Ge.

19. The electronic device according to claim 12, wherein the thickness of the second source region and/or the second drain region is 5 nm-50 nm.

20. The electronic device according to claim 12, wherein the GAA MOSFET device also includes:

channel layers, formed between the first source region and the first drain region, and all the channel layers are arranged at intervals along a second direction away from the substrate;

gate dielectric layers and a control gate, each gate dielectric layer wraps a portion of the surface of a corresponding channel layer; the control gate wraps the surface of all the gate dielectric layers;

inner walls, formed on the surface of the channel layers between the first source region and the each gate dielectric layer, and between the first drain region and the each gate dielectric layer;

a source metal layer, a gate metal layer, and a drain metal layer; the source metal layer and the drain metal layer are respectively formed on the surface of the first source region and the first drain region, and fully wrapped the first source region and the second source region, and the first drain region and the second drain region, respectively; the gate metal layer is formed on the top of the control gate;

an interlayer dielectric layer, covering the surface of the source metal layer, the gate metal layer, the drain metal layer, and the inner walls;

a metal contact layer, penetrating the interlayer dielectric layer, and respectively connecting the source metal layer, the gate metal layer, and the drain metal layer.

* * * * *